United States Patent [19]

Shibuya et al.

[11] 4,364,672
[45] Dec. 21, 1982

[54] METHOD FOR DRIVING LIQUID CRYSTAL DISPLAY ELEMENTS

[75] Inventors: Yoshimichi Shibuya; Masami Takahashi; Tadashi Ishibashi, all of Mobara, Japan

[73] Assignee: Hitachi, Ltd., Tokyo, Japan

[21] Appl. No.: 138,977

[22] Filed: Apr. 10, 1980

[30] Foreign Application Priority Data

Apr. 13, 1979 [JP] Japan .................. 54-44153

[51] Int. Cl.³ .................. G04L 17/00; G09F 9/00
[52] U.S. Cl. ......................... 368/240; 368/242; 340/765; 350/332
[58] Field of Search .................. 368/30, 62, 84, 223, 368/239, 240, 242, 82, 83, 241; 340/765, 784, 802, 805, 811; 350/331 R, 332-334

[56] References Cited

U.S. PATENT DOCUMENTS

| | | | |
|---|---|---|---|
| 3,877,017 | 4/1975 | Kawakami et al. | 350/332 |
| 3,976,362 | 8/1976 | Kawakami | 350/333 |
| 3,987,617 | 10/1976 | Sloh | 368/242 |
| 3,995,942 | 12/1976 | Kawakami et al. | 350/333 |
| 4,076,385 | 2/1978 | Kondo | 350/332 |
| 4,078,374 | 3/1978 | Kondo | 350/332 X |
| 4,079,369 | 3/1978 | Fukumoto | 368/242 X |
| 4,100,540 | 7/1978 | Fujita et al. | 340/765 |
| 4,212,159 | 7/1980 | Noble et al. | 368/132 X |

FOREIGN PATENT DOCUMENTS

2908764 9/1979 Fed. Rep. of Germany ...... 368/240

*Primary Examiner*—Vit W. Miska
*Attorney, Agent, or Firm*—Antonelli, Terry & Wands

[57] ABSTRACT

A method for driving a liquid crystal display element so as to give a simultaneous analogue display of 3 kinds of information. The liquid crystal display element is driven over $\frac{1}{3}$-duty periods by applying 4 kinds of voltage waveforms to one electrode formed on one of paired substrates, and at least 5 kinds of voltage waveforms to the other electrode on the other substrate, said electrodes being divided into a multiplicity of electrode patterns. In particular, one of the 4 kinds of voltage waveforms applied to the electrodes of one of said substrates is set to provide an OFF condition for the display regardless of which of the at least 5 voltage waveforms is applied to the electrodes of said other substrate. In this driving method only one chip of the element driving LSI is sufficient for a simultaneous analogue display of 3 kinds of information e.g. hour, minute, and second.

7 Claims, 13 Drawing Figures

FIG. 1

PRIOR ART

METHOD FOR DRIVING LIQUID CRYSTAL DISPLAY ELEMENTS

This invention relates to a method for driving a liquid crystal display element, in particular a liquid-crystal analogue display giving simultaneously three kinds of information.

A conventional liquid-crystal display element for watches has, on its face plate, 60 minute display segments used for second display as well and 60 hours display segments used for minute display as well, so that it can give an analogue display similar to those of mechanical ones. Such an element comprises the 60 minute display segments arranged radially to surround the 60 hour display segments arranged also radially, and is operated in a ½-bias and ½-duty period division driving mode. However, in order to drive such a liquid crystal display element having 120 display segments driven in a ½-bias and ½-duty period division mode, 60 segment electrodes for an upper electrode pattern and two common electrodes for a lower electrode pattern, or 62 terminals in total, are required. This implies that two LSI chips are required for the element, since the maximum number of pins of an LSI chip for driving a liquid-crystal display element is 50. Since the use of two chips require more than twice the space necessary for one chip, it has been very difficult to make, for example, a wrist watch of a thin, small, and light construction. Moreover, the use of two driving LSI chips not only raises the cost of a driving system, but also lowers its production yield and reliability against vibrations encountered during its usage on account of increased connections between the LSI's and the substrates therefor, and between the substrates and the element.

An object of this invention is to provide a method for driving a liquid-crystal display element designed to display 3 kinds of information simultaneously by the use of appropriate combinations of voltage waveforms applied thereto so that terminals can be decreased in number and that only one chip element driving LSI suffices.

According to the present invention there is provided a method for driving a liquid crystal display element whose electrodes on a pair of substrates are each divided into a plurality of blocks so that analogue display for at least 3 different pieces of information can be given between the pair of the substrates, wherein the electrode on one of the paired substrates is impressed with 4 kinds of voltages having different waveforms and the electrode on the other substrate of the pair is impressed with at least 5 kinds of voltages having different waveforms, thereby driving the liquid crystal over ½-duty periods to display 3 arbitrary kinds of information.

Other objects, features and advantages of the present invention will be readily apparent from the detailed descriptions taken in conjunction with the accompanying drawings, in which:

Referring now to the drawings, prior arts will further be described in advance of explanation of the embodiments of this invention.

Figure 1:
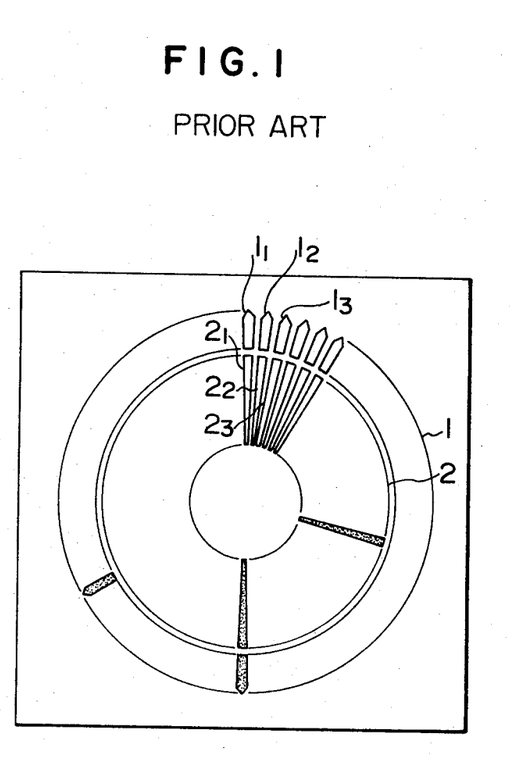
FIG. 1 illustrates an arrangement of display segments used in a conventional watch having a liquid crystal display.
Figure 2A:
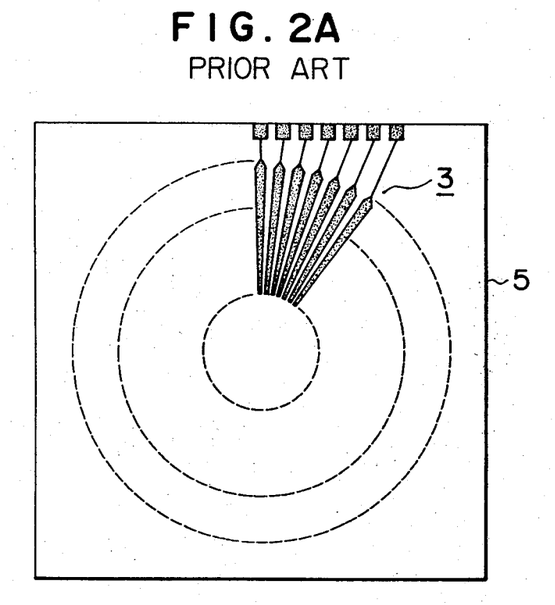
FIG. 2A and FIG. 2B show respective upper and lower electrode patterns of the segments shown in FIG. 1.
Figure 2B:
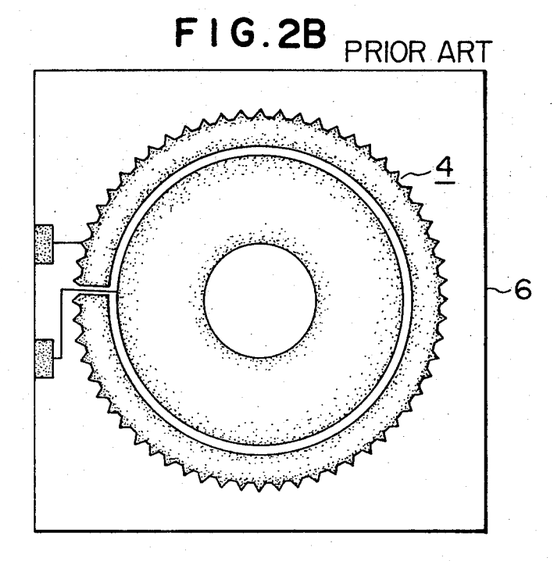

FIG. 1 shows display segments of a conventional liquid crystal display element of a watch having three kinds of analogue display for hour, minute, and second. Segments $1_1, 1_2, 1_3 \ldots, 1_{60}$ are minute display segments 1, which are also used to display second (hereinafter referred to as second-minute display segments) and arranged radially on, and angularly spaced in sixty equal divisions along the periphery of, an hour plate (not shown). Segments $2_1, 2_2, 2_3 \ldots, 2_{60}$ are hour display segments 2, which are also used to display minutes (hereinafter referred to as minute-hour display segments), and which are arranged radially along the same sixty radial axes as for the second-minute display segments 1 and radially inside thereof. The time shown in FIG. 1 is 3:30 and 40 seconds. In a watch having such a display, upper and lower electrode patterns 3 and 4 exhibiting second-minute display segments 1 and minute-hour display segments 2 through ½-bias and ½-duty period driving of these patterns, are formed on transparent upper and lower substrates 5 and 6, respectively, as shown in FIGS. 2A and 2B. Between these upper and lower electrode patterns 3 and 4 is a liquid crystal (not shown) to form a liquid crystal display element.

However, in a watch display such as above having 120 display segments driven in a ½-bias and ½-duty period division driving mode, 60 segment electrodes (upper electrodes 3) and 2 common electrodes (lower electrode patterns 4), namely 62 terminals in total, are required as shown in FIGS. 2A and 2B, i.e. 2 chips of LSI are required since each LSI chip for driving a liquid crystal display element has at most 50 pins.

The present invention will now be described below.

Figure 3A:
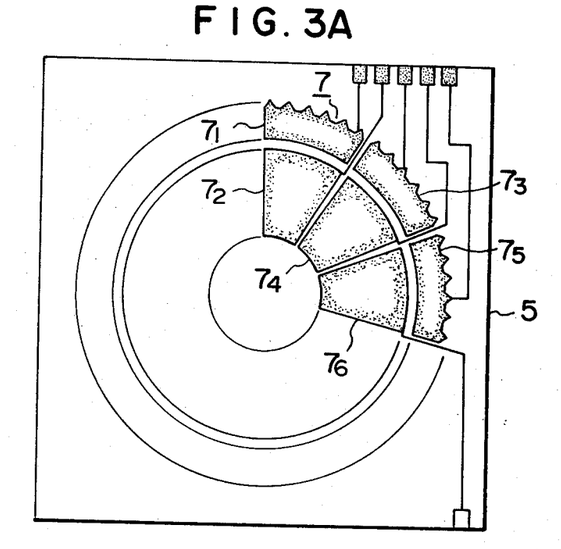
FIGS. 3A and 3B show upper and lower electrode patterns of a liquid crystal display element, respectively.
Figure 3B:
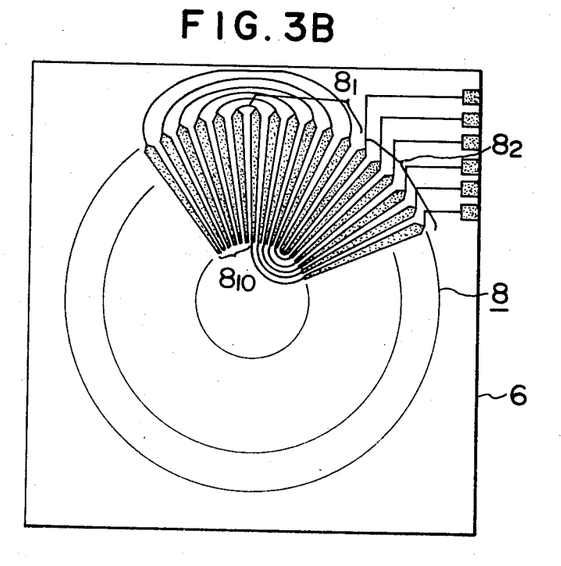

Shown in FIGS. 3A and 3B are electrode patterns formed for the display segments 1 and 2 of a liquid crystal display element in accordance with this invention. FIG. 3A shows particularly a portion of upper electrode patterns 7 formed on the internal surface of the upper substrate 5 and comprising 20 electrode patterns $7_1, 7_2, 7_3 \ldots, 7_{20}$, which are formed to correspond to 10 blocks dividing 60 display segments 1 by six and another 10 blocks dividing 60 display segments 2 by six. These 20 electrode patterns are forming substantially fan-shaped blocks. FIG. 3B shows particularly a portion of lower electrode patterns 8 formed on the lower substrate 6. The lower electrode patterns 8 are formed in substantially the same configuration as the display segments 1 and 2 and made up of 10 blocks of segment electrode patterns $8_1, 8_2, 8_3, \ldots, 8_{10}$, each block comprising 6 electrodes, and having 6 terminals, electrically connected in series with one such electrode in its neighbouring block.

With this arrangement of the electrodes, the number of the terminals of the upper and lower electrode patterns 7 and 8 can be decreased to a total of 26: Of these, 20 terminals are on the upper substrate 5 and 6 for the lower substrate 6, thereby requiring only one chip of LSI for driving the element.

Figure 4A:
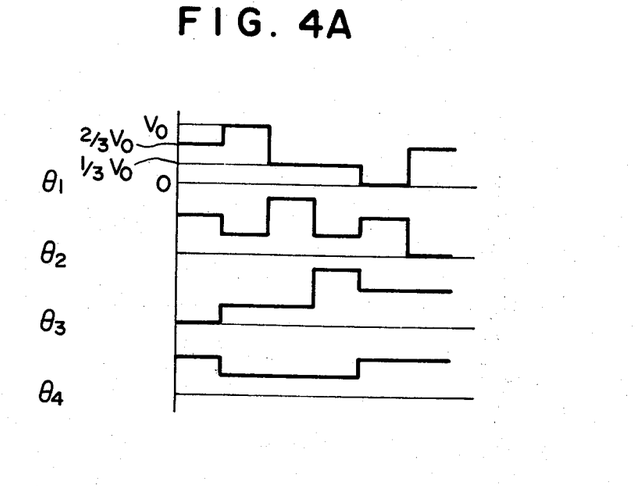
FIGS. 4A and 4B show voltage waveforms used in accordance with this invention to drive a liquid crystal display element.
Figure 4B:
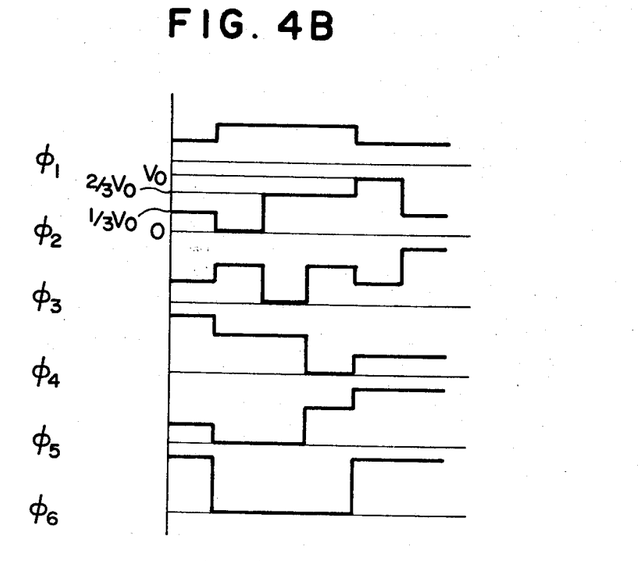

A method of this invention for driving a liquid crystal display element utilizes $\frac{1}{5}$-duty block division driving with driving waveforms given by FIGS. 4A and 4B. Namely, the lower electrode patterns are impressed with voltages having waveforms $\theta_1$ through $\theta_4$ shown in FIG. 4A in some combinations, while the upper electrode patterns are impressed with voltages having waveforms $\phi_1$ through $\phi_6$ as shown in FIG. 4B in some combinations. As can be seen in these two figures, the actual voltage levels have values selected from 0, $\frac{1}{3}$ V$_0$, $\frac{2}{3}$ V$_0$ and V$_0$. The combinations of two waveforms, one from those of $\theta_1$ through $\theta_3$ and another from those of $\phi_1$ through $\phi_6$, is the same as those used in conventional $\frac{1}{3}$-bias and $\frac{1}{5}$ duty period division modes. In this embodiment, further there is employed a driving voltage of the waveform $\theta_4$ to be applied to the lower electrode patterns. The state of the liquid crystal display element under such combinations of the waveforms is given in Table 1. Since there are 3 kinds of driving voltage waveforms involved in the common electrode and 8 kinds of driving voltage waveforms involved in the lower electrodes in a conventional $\frac{1}{3}$-bias and $\frac{1}{5}$-duty period division system, 3×8 or 24 combinations are possible. On the other hand the present invention attains a desired display by an adequate selection of some combinations out of 4×6 or 24 combinations. ON's in Table 1 indicate on-conditions of the liquid crystal display element, while OFF's indicate off-conditions thereof.

TABLE 1

| $\theta_j$ | $\phi_i$ | | | | | |
|---|---|---|---|---|---|---|
|  | $\phi_1$ | $\phi_2$ | $\phi_3$ | $\phi_4$ | $\phi_5$ | $\phi_6$ |
| $\theta_1$ | OFF | ON | OFF | OFF | ON | ON |
| $\theta_2$ | OFF | OFF | ON | OFF | ON | ON |
| $\theta_3$ | OFF | OFF | OFF | ON | OFF | ON |
| $\theta_4$ | OFF | OFF | OFF | OFF | OFF | OFF |

Figure 6:
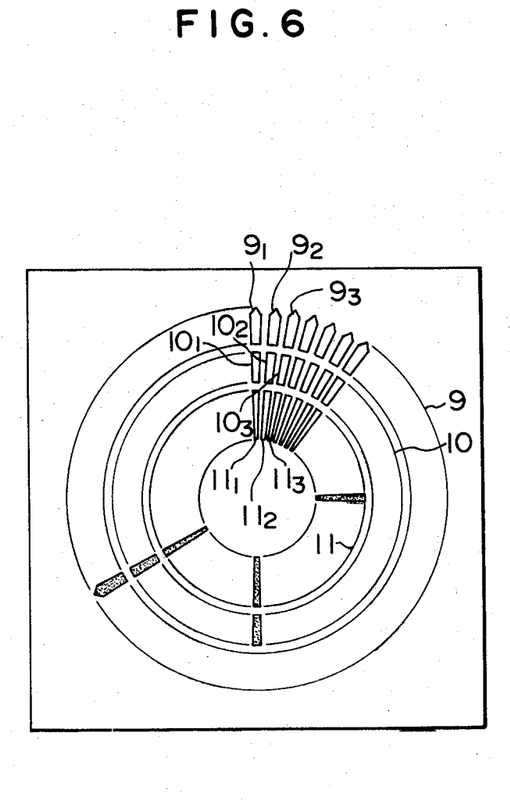
FIG. 6 shows the arrangement of segments of a liquid crystal element, illustrating the second embodiment of the invention for driving the element.
Figure 7A:
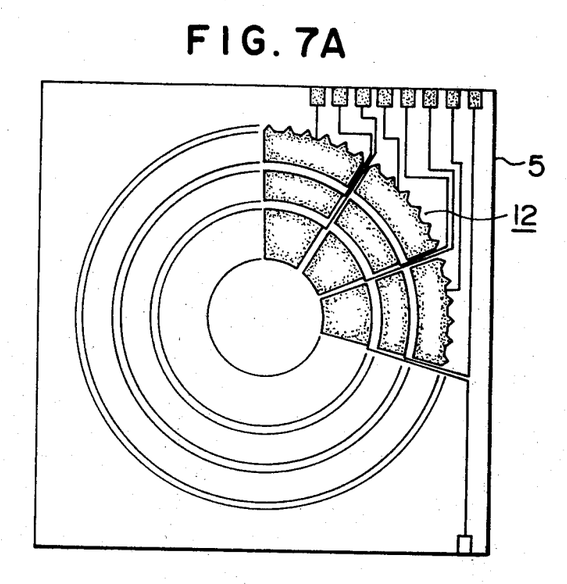
FIGS. 7A and 7B show upper and lower electrode patterns of the segments respectively shown in FIG. 6.
Figure 7B:
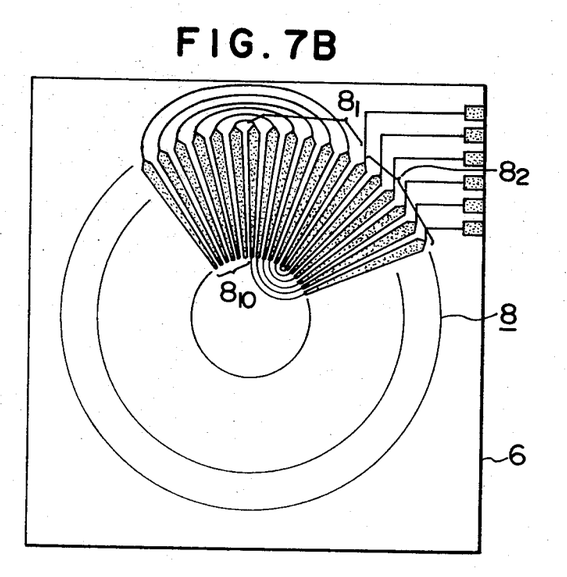

With these waveforms for block divisions (referred to as block division waveforms) given by the driving voltage waveforms, and with a set of 120 display segments as shown in FIGS. 3A and 3B associated with the upper and lower electrode patterns 7 and 8, respectively, a simultaneous analogue display of hour, minute, and second as shown in FIG. 1 is enabled by means of 4×5 or 20 such combinations, i.e. the simultaneous display can be made by the use of 20 upper electrode patterns plus 6 lower electrode patterns which require a total of 26 electrode terminals. Also a simultaneous display of hour, minute, and second on a display as shown in FIG. 6 can be given by the 4×6 or 24 combinations of the waveforms, $\phi_1$ through $\phi_6$ being applied to upper electrode patterns 12 as shown in FIG. 7A, and $\theta_1$ through $\theta_4$ applied to lower electrode patterns 8 as shown in FIG. 7B. The invention will be further described in detail by way of example below.

Figure 5A:
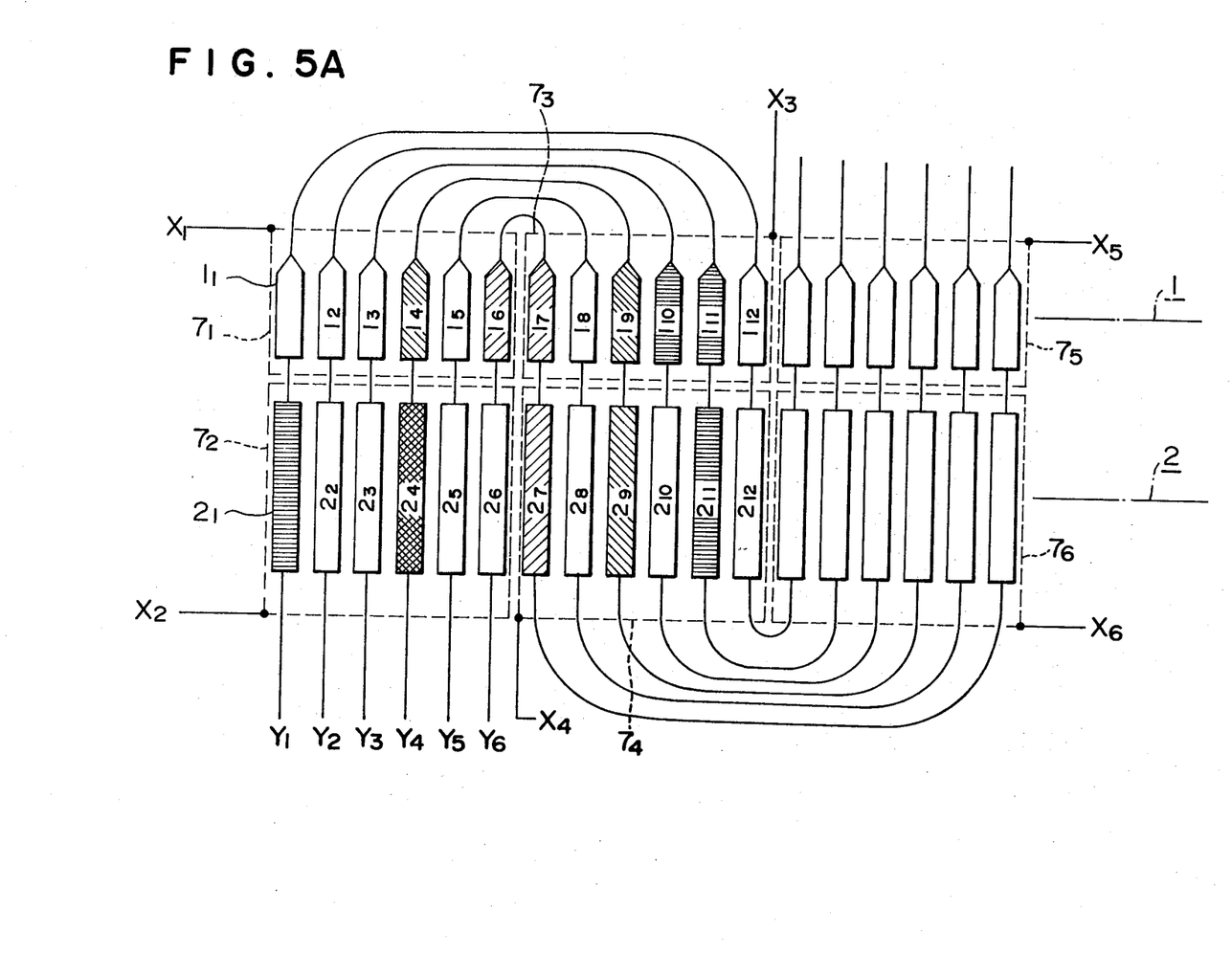
FIGS. 5A and 5B show the arrangement of a main portion of segments of a liquid crystal display element, illustrating a first embodiment of the invention for driving the element.
Figure 5B:
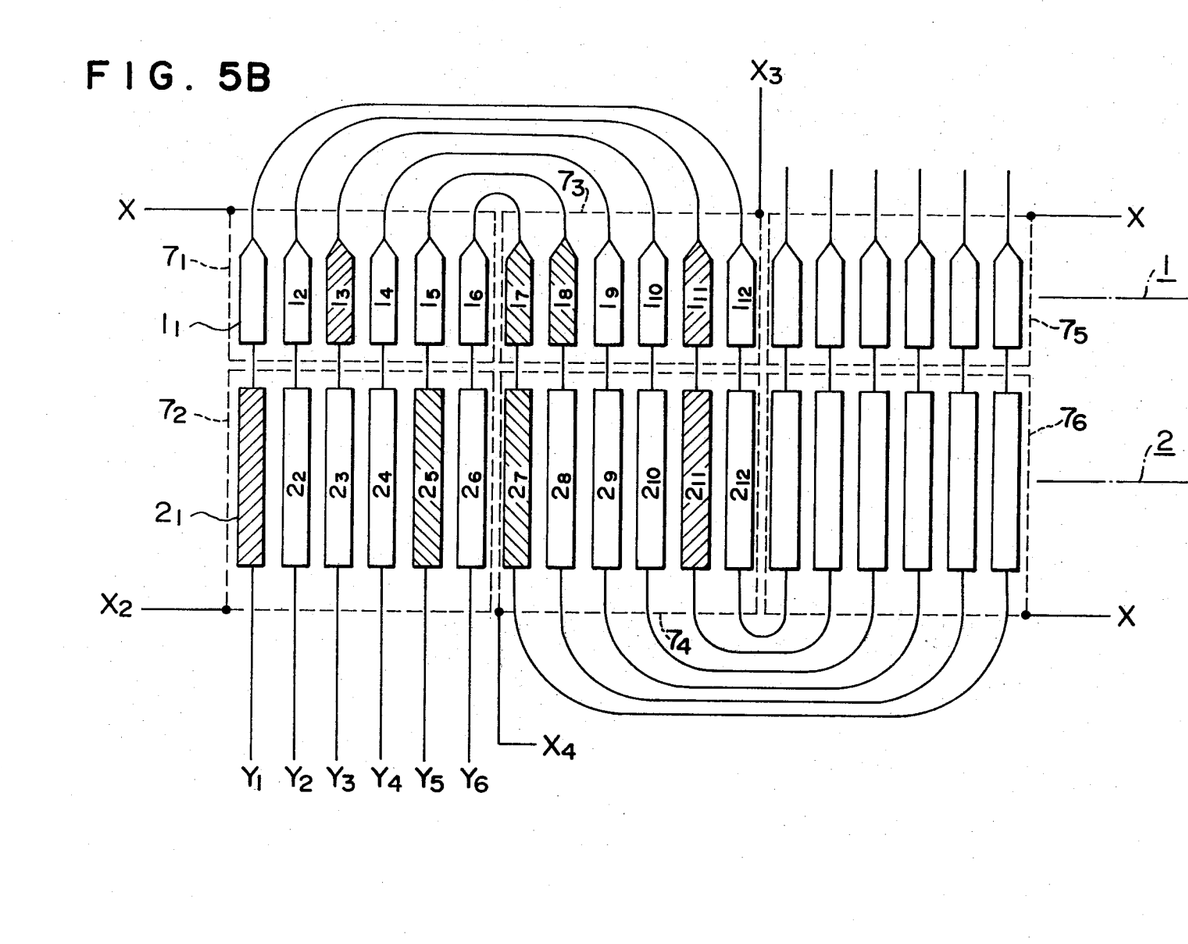

FIGS. 5A and 5B show the arrangement of a main portion of 120 display segments for a simultaneous analogue display of 3 kinds of information, in particular hour, minute, and second of a watch having a liquid crystal display whose upper and lower electrode patterns 7 and 8 are divided in blocks as shown in FIGS. 3A and 3B. Portions of the Figures identical with those already mentioned above bear the same numbers and no further descriptions thereof will be given. A simultaneous analogue display of a particular hour by, for example, the display segment $2_1$, a particular minute by the display segments $1_{11}$ and $2_{11}$, and a particular second by the display segments $1_{10}$, which are shaded by lateral stripes in FIG. 5A, is given by applying appropriately chosen voltage waveforms $\theta_1$ through $\theta_4$ and $\phi_1$, $\phi_3$, $\phi_4$, and $\phi_5$ shown in FIGS. 4A and 4B, to the electrodes so as to realize the state as defined by Table 2 below, in which state the second-minute display segments $1_{10}$ and $1_{11}$ and the minute-hour display segments $2_1$ and $2_{11}$ are lit.

TABLE 2

| upper electrode | waveform to upper electrode | lower electrode | | | | | |
|---|---|---|---|---|---|---|---|
|  |  | $Y_1$ | $Y_2$ | $Y_3$ | $Y_4$ | $Y_5$ | $Y_6$ |
|  |  | waveform to lower electrode | | | | | |
|  |  | $\theta_3$ | $\theta_2$ | $\theta_1$ | $\theta_4$ | $\theta_4$ | $\theta_4$ |
| $x_1$ | $\phi_1$ | OFF | OFF | OFF | OFF | OFF | OFF |
| $x_2$ | $\phi_4$ | ON | OFF | OFF | OFF | OFF | OFF |
| $x_3$ | $\phi_5$ | OFF | ON | ON | OFF | OFF | OFF |
| $x_4$ | $\phi_3$ | OFF | ON | OFF | OFF | OFF | OFF |
| $x_5$ | $\phi_1$ | OFF | OFF | OFF | OFF | OFF | OFF |
| $x_6$ | $\phi_1$ | OFF | OFF | OFF | OFF | OFF | OFF |

Also a simultaneous analogue display of a particular hour by the display segment $2_4$, a particular minute by the display segments $1_7$ and $2_7$, and a particular second by the display segment $1_6$, which are shaded by oblique lines, is made possible by applying the voltage waveforms $\phi_1$ through $\phi_3$ and $\theta_1$ through $\theta_3$ to the electrodes to realize a state as defined by Table 3 below.

TABLE 3

| upper electrode | waveform applied to upper electrode | lower electrode | | | | | |
|---|---|---|---|---|---|---|---|
|  |  | $Y_1$ | $Y_2$ | $Y_3$ | $Y_4$ | $Y_5$ | $Y_6$ |
|  |  | waveform applied to lower electrode | | | | | |
|  |  | $\theta_3$ | $\theta_3$ | $\theta_3$ | $\theta_1$ | $\theta_3$ | $\theta_2$ |
| $x_1$ | $\phi_3$ | OFF | OFF | OFF | OFF | OFF | ON |
| $x_2$ | $\phi_2$ | OFF | OFF | OFF | ON | OFF | OFF |
| $x_3$ | $\phi_3$ | OFF | OFF | OFF | OFF | OFF | ON |
| $x_4$ | $\phi_3$ | OFF | OFF | OFF | OFF | OFF | ON |
| $x_5$ | $\phi_1$ | OFF | OFF | OFF | OFF | OFF | OFF |
| $x_6$ | $\phi_1$ | OFF | OFF | OFF | OFF | OFF | OFF |

Similarly the simultaneous lighting of the second-minute display segments $1_4$ and $1_9$ and the minute-hour display segments $2_4$ and $2_9$ shaded by oblique lines in FIG. 5A can be performed by applying the voltage waveforms $\theta_1$, $\theta_2$, $\phi_1$, and $\phi_2$ to realize a state shown in Table 4.

TABLE 4

| upper electrode | waveform applied to upper electrode | lower electrode | | |
|---|---|---|---|---|
|  |  | $Y_3$ | $Y_4$ | $Y_5$ |
|  |  | waveform applied to lower electrode | | |
|  |  | $\theta_2$ | $\theta_1$ | $\theta_2$ |
| $x_3$ | $\phi_2$ | OFF | ON | OFF |
| $x_4$ | $\phi_2$ | OFF | ON | OFF |
| $x_5$ | $\phi_1$ | OFF | OFF | OFF |

Similarly an analogue display as shown in FIG. 5B can be performed by the combination of waveforms as shown in Table 5 which turn on the second-minute display segments $1_3$ and $1_{11}$ and the minute-hour display segments $2_1$ and $2_{11}$ shaded by oblique lines in FIG. 5B. Turning on of the second-minute display segments $1_7$ and $1_8$ and the minute-hour display segments $2_5$ and $2_7$ shaded by oblique lines in FIG. 5B is made possible by the combinations of waveforms as shown in Table 6.

TABLE 5

| upper electrode | waveform applied to upper electrode | lower electrode | | | |
|---|---|---|---|---|---|
| | | $Y_1$ | $Y_2$ | $Y_3$ | $Y_4$ |
| | | waveform applied to lower electrode | | | |
| | | $\theta_1$ | $\theta_2$ | $\theta_3$ | $\theta_4$ |
| $x_1$ | $\phi_4$ | OFF | OFF | ON | OFF |
| $x_2$ | $\phi_2$ | ON | OFF | OFF | OFF |
| $x_3$ | $\phi_3$ | OFF | ON | OFF | OFF |
| $x_4$ | $\phi_3$ | OFF | ON | OFF | OFF |
| $x_5$ | $\phi_1$ | OFF | OFF | OFF | OFF |

TABLE 6

| upper electrode | waveform applied to upper electrode | lower electrode | | |
|---|---|---|---|---|
| | | $Y_4$ | $Y_5$ | $Y_6$ |
| | | waveform applied to lower electrode | | |
| | | $\theta_4$ | $\theta_2$ | $\theta_1$ |
| $x_1$ | $\phi_1$ | OFF | OFF | OFF |
| $x_2$ | $\phi_3$ | OFF | ON | OFF |
| $x_3$ | $\phi_5$ | OFF | ON | ON |
| $x_4$ | $\phi_2$ | OFF | OFF | ON |

Thus a simultaneous analogue display of hour, minute, and second by means of 120 display segments is possible by applying the voltage waveforms $\phi_1$ through $\phi_5$ to the upper electrodes, and the waveforms $\theta_1$ through $\theta_4$ to the lower electrodes, thereby yielding 4×5 or 20 combinations of such waveforms.

FIG. 6 shows another arrangement of liquid crystal display segments for a watch, illustrating another embodiment of the driving method of the invention for driving liquid crystal displays. In this Figure, segments $9_1, 9_2, 9_3 \ldots, 9_{60}$ forming a set of second-display segments 9, are arranged radially on, and angularly equally spaced along the periphery of, an hour plate (not shown). Segments $10_1, 10_2, 10_3, \ldots, 10_{60}$ forming a set of second display segments 10, and also serving as minute display segments (hereinafter referred to as minute-second display segments), are arranged along the same radial axes as, and angularly equally spaced inside, the second display segments 9. Segments $11_1, 11_2, 11_3, \ldots, 11_{60}$ forming a set of second display segments 11 which also serve as hour and minute display segments (hereinafter referred to as hour-minute-second display segments), are arranged along the same radial axes as, and angularly equally spaced inside, the minute-second display segments 10. Thus, there are 180 display segments so that they can indicate time in the same manner as a mechanical analogue watch having three hands. In FIG. 6, the time shown is 3:30 and 40 seconds.

FIGS. 7A and 7B show examples of electrode patterns for the display segments 9, 10, and 11. In particular, FIG. 7A shows a portion of the upper electrode patterns 12 formed on the internal surface of an upper substrate 5. Included in the upper electrode patterns 12 are substantially fan-shaped 30 electrode patterns $12_1, 12_2, 12_3, \ldots, 12_{30}$, each pattern being opposed by one of 10 blocks of the segments 9, one of 10 blocks of the segments 10, and one of 10 blocks of the segments 11, each block corresponding to 6 such segments. FIG. 7B shows lower electrode patterns 8 formed on the internal surface of a lower substrate 6 in correspondence with the display segments 9, 10, and 11. Included in these lower electrode patterns are 10 blocks of segment electrode patterns $8_1, 8_2, 8_3, \ldots, 8_{10}$, each block comprising 6 electrode patterns, each pattern being electrically connected in series, as previously described in connection with FIGS. 3A and 3B, with another electrode pattern in its neighboring block. Hence, the lower electrode patterns have 6 terminals.

With this construction the number of terminals of the upper and lower electrode patterns 12 and 8 is 36, i.e. 30 terminals for the upper electrode patterns $12_1, 12_2, 12_3, \ldots, 12_{30}$, and 6 terminals for the lower electrode patterns $8_1, 8_2, 8_3, \ldots, 8_{10}$, thereby requiring only one chip of driving LSI. The analogue display having 3 hands as shown in FIG. 6, similar to a mechanical analogue display, can be performed by applying to the upper electrode patterns 12 the voltage waveforms $\phi_1$ through $\phi_6$ shown in FIG. 4A, and to the lower electrode patterns 8 the waveforms $\theta_1$ through $\theta_4$, thereby yielding 4×6 or 24 different combinations of voltages. Further details will be described below concerning the embodiment.

Figure 8:
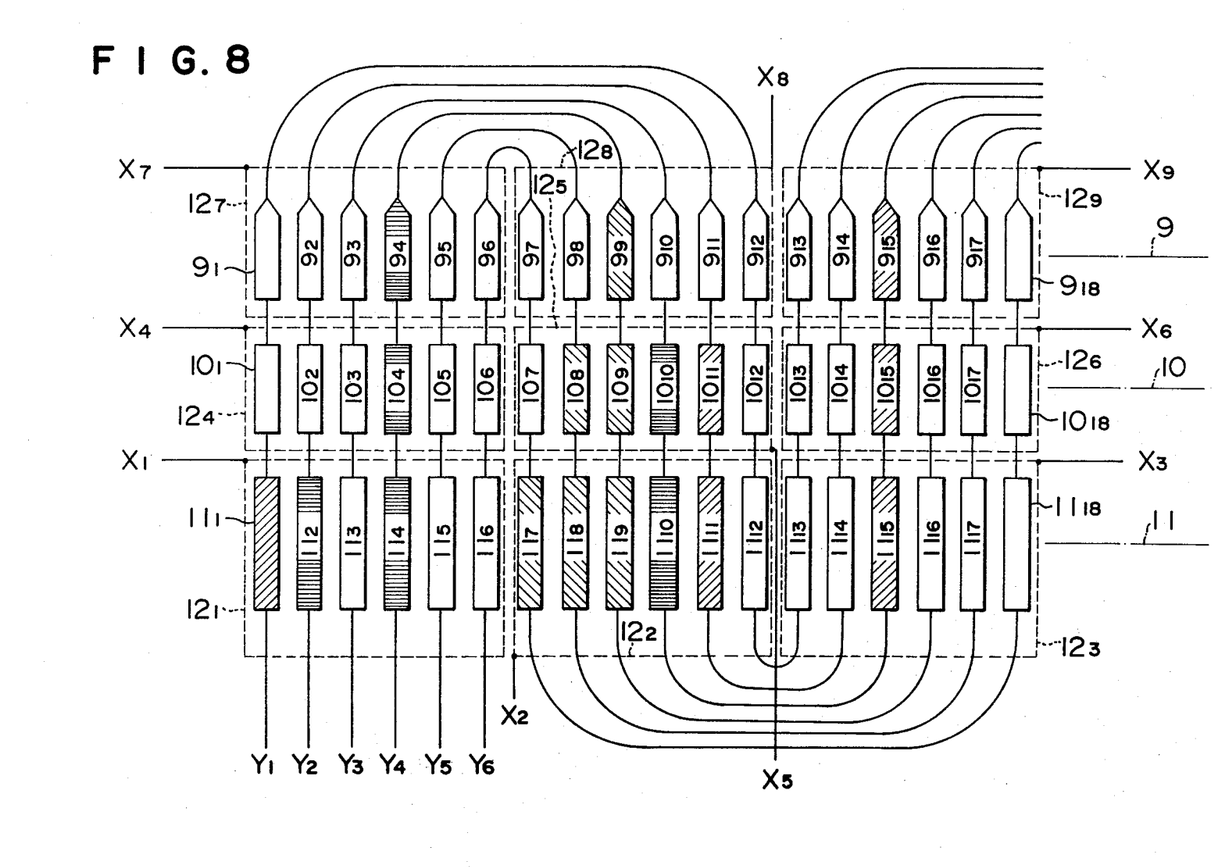
FIG. 8 shows a main portion of segments of a liquid crystal display element, illustrating the second embodiment of the invention for driving the element.

FIG. 8 shows a main portion of the 180 display segments which have been grouped into the blocks, as shown in FIGS. 7A and 7B, associated with the upper and the lower electrode patterns 12 and 8, respectively, to present a simultaneous analogue display of 3 kinds of information, in a particular hour, minute, and second in a liquid-crystal display watch. Portions numbered the same as those previously mentioned will not be described again. In a simultaneous analogue display displaying hour by the display segment $11_1$, minute by the display segments $10_{11}$ and $11_{11}$, and second by the display segments $9_{15}, 10_{15}$, and $11_{15}$ by lighting the second display segment $9_{15}$, the minute-second display segments $10_{11}$ and $10_{15}$, and the hour-second display segments $11_1, 11_{11}$, and $11_{15}$, all shaded by oblique lines in FIG. 8, the voltage waveforms $\theta_1$ through $\theta_4$ and $\phi_1$ through $\phi_4$ of FIGS. 4A and 4B are selectively applied to the electrodes so that the state defined in Table 7 can be realized.

TABLE 7

| upper electrode | waveform applied to upper electrode | lower electrode | | | |
|---|---|---|---|---|---|
| | | $Y_1$ | $Y_2$ | $Y_3$ | $Y_4$ |
| | | waveform applied to lower electrode | | | |
| | | $\theta_1$ | $\theta_2$ | $\theta_3$ | $\theta_4$ |
| $x_1$ | $\phi_2$ | ON | OFF | OFF | OFF |
| $x_2$ | $\phi_3$ | OFF | ON | OFF | OFF |
| $x_3$ | $\phi_4$ | OFF | OFF | ON | OFF |
| $x_4$ | $\phi_1$ | OFF | OFF | OFF | OFF |

Similarly in order to give a simultaneous display of hour by the display segment $11_7$, minute by the display segments $10_8$ and $11_8$, second by the display segments $9_9$, $10_9$, and $11_9$ in the analogue display mode by lighting the second display segment $9_9$, the minute-second display segment $10_8$ and $10_9$, and the hour-minute-second display segments $11_7, 11_8, 11_9$, all shaded by oblique lines in FIG. 8, the voltage waveforms $\theta_1$ through $\theta_4$, $\phi_1, \phi_2, \phi_5$, and $\phi_6$ of FIGS. 4A and 4B are selectively applied to the electrodes to realize the state defined by Table 8.

TABLE 8

| upper electrode | waveforms applied to upper electrode | lower electrode | | | |
|---|---|---|---|---|---|
| | | $Y_1$ | $Y_4$ | $Y_5$ | $Y_6$ |
| | | waveforms applied to lower electrode | | | |
| | | $\theta_4$ | $\theta_1$ | $\theta_2$ | $\theta_3$ |
| $x_1$ | $\phi_1$ | OFF | OFF | OFF | OFF |
| $x_2$ | $\phi_6$ | OFF | ON | ON | ON |

TABLE 8-continued

| upper electrode | waveforms applied to upper electrode | lower electrode | | | |
|---|---|---|---|---|---|
| | | $Y_1$ | $Y_4$ | $Y_5$ | $Y_6$ |
| | | \multicolumn{4}{c}{waveforms applied to lower electrode} | | | |
| | | $\theta_4$ | $\theta_1$ | $\theta_2$ | $\theta_3$ |
| $x_5$ | $\phi_5$ | OFF | ON | ON | OFF |
| $x_8$ | $\phi_2$ | OFF | ON | OFF | OFF |

In a manner similar to the foregoing examples a simultaneous analogue display of hour, minute, and second by lighting the second display segment $9_4$, the minute-second display segments $10_4$ and $10_{10}$, and the hour-minute-second display segments $11_2$, $11_4$, and $11_{10}$, all shaded by horizontal lines in FIG. 8, can be given by the selective application of the waveforms $\theta_1$ through $\theta_4$, $\phi_1$, $\phi_3$, $\phi_4$, and $\phi_5$ to realize the state defined by Table 9.

TABLE 9

| upper electrode | waveforms applied to upper electrode | lower electrode | | | |
|---|---|---|---|---|---|
| | | $Y_2$ | $Y_3$ | $Y_4$ | $Y_5$ |
| | | \multicolumn{4}{c}{waveforms applied to lower electrode} | | | |
| | | $\theta_1$ | $\theta_3$ | $\theta_2$ | $\theta_4$ |
| $x_1$ | $\phi_5$ | ON | OFF | ON | OFF |
| $x_2$ | $\phi_4$ | OFF | ON | OFF | OFF |
| $x_4$ | $\phi_3$ | OFF | OFF | ON | OFF |
| $x_8$ | $\phi_1$ | OFF | OFF | OFF | OFF |

Thus, a simutaneous display of three kinds of information, i.e. hour, minute, and second of a liquid-crystal display watch having 180 display segments, can be performed by 4×6 or 24 combinations of the voltage waveforms $\phi_1$ through $\phi_6$ to be applied to the upper electrodes and $\theta_1$ through $\theta_4$ to be applied to the lower electrodes.

For other displays such as alarm displays, AM·PM displays, date displays, and day displays, to be provided in some cases on the same hour plate as for time display segments, the ⅓-duty period division mode is not applicable. Therefore, in order to decrease the number of terminals for them, at least date and day displays should be driven in a ⅓—⅓ period division driving mode, while alarm and AM·PM displays should be driven in a static driving mode or in a ⅓—⅓ period division driving mode.

It should be understood that although the invention is described above in connection with driving liquid-crystal displays for watches, the invention is in no way limited to the examples above, but is also applicable to methods for driving other forms of liquid crystal displays such as those in the form of bar displays in some watches as well as those used in various measuring instruments.

What we claim is:

1. A method for driving a liquid crystal display element disposed between a pair of substrates and having electrodes on the substrates, said electrodes being divided into a multiplicity of blocks to give an analogue display of at least 3 kinds of information, wherein said liquid crystal is driven over a ⅓-duty period by applying four kinds of voltage waveforms to the electrodes on one of said substrate and at least five kinds of voltage waveforms to the electrodes on the other substrate, thereby simultaneously displaying three arbitrary pieces of the information, and wherein one of said four kinds of voltage waveforms applied to the electrodes of one of said substrates is set to provide an OFF condition for the display regardless of which of the at least five voltage waveforms is applied to the electrodes of said other substrate.

2. A method according to claim 1 wherein hour, minute, and second are simultaneously displayed in a form of analogue display by applying four kinds of voltage waveforms to said electrodes on one of said substrates, and five kinds of voltage waveforms to said electrodes on the other substrate.

3. A method according to claim 1 wherein hour, minute, and second are simultaneously displayed in a form of analogue display by applying four kinds of voltage waveforms to said electrodes on one of said substrates, and six kinds of voltage waveforms to said electrodes on the other substrate.

4. A method according to claim 1 wherein said electrodes on one of said substrates are divided into ten segment electrode patterns and said electrodes on the other substrate are divided into twenty electrode patterns.

5. A method according to claim 1 wherein said electrodes on one of said substrates are divided into ten segment electrode patterns, and said electrode on the other substrate are divided into thirty electrode patterns.

6. A method according to claim 1, wherein the voltage waveforms applied to said substrates are ⅓-bias voltages having levels selected from a group consisting of 0, ⅓ $V_0$, ⅔ $V_0$ and $V_0$.

7. A method according to claim 1, wherein said electrodes on one of said substrate to which said four kinds of voltage waveforms are applied are divided into common electrode patterns and the electrodes on said other substrate to which said at least five voltage waveforms are applied are divided into segment electrode patterns.

* * * * *